(12) United States Patent
Manetakis

(10) Patent No.: US 9,559,702 B1
(45) Date of Patent: Jan. 31, 2017

(54) CIRCUITS AND METHODS FOR FLICKER NOISE UPCONVERSION MINIMIZATION IN AN OSCILLATOR

(71) Applicant: Marvell International Ltd., Hamilton (BM)

(72) Inventor: Konstantinos Manetakis, Lausanne (CH)

(73) Assignee: MARVELL INTERNATIONAL LTD., Hamilton (BM)

( * ) Notice: Subject to any disclaimer, the term of this patent is extended or adjusted under 35 U.S.C. 154(b) by 0 days.

(21) Appl. No.: 14/503,173

(22) Filed: Sep. 30, 2014

Related U.S. Application Data

(60) Provisional application No. 61/884,580, filed on Sep. 30, 2013, provisional application No. 61/947,907, filed on Mar. 4, 2014, provisional application No. 61/972,997, filed on Mar. 31, 2014.

(51) Int. Cl.
*H03L 7/00* (2006.01)
*H03B 5/12* (2006.01)
*H03B 5/08* (2006.01)
*H03B 5/00* (2006.01)

(52) U.S. Cl.
CPC ............. *H03L 7/00* (2013.01); *H03B 5/1228* (2013.01); *H03B 5/00* (2013.01); *H03B 5/08* (2013.01); *H03B 5/12* (2013.01); *H03B 2201/0208* (2013.01)

(58) Field of Classification Search
CPC ............. H03L 7/00; H03B 5/00; H03B 5/08; H03B 5/12; H03B 5/1228; H03B 2201/0208
USPC ................... 331/117 R, 117 FE, 108 A, 167
See application file for complete search history.

(56) References Cited

U.S. PATENT DOCUMENTS

| | | | | |
|---|---|---|---|---|
| 7,463,106 | B2 * | 12/2008 | Shin et al. .................. | 331/167 |
| 8,159,308 | B1 * | 4/2012 | Sutardja .................. | H03L 5/00 |
| | | | | 331/117 FE |
| 2003/0210101 | A1 * | 11/2003 | McCorquodale et al. ................ | H01F 17/0006 |
| | | | | 331/117 FE |
| 2004/0066241 | A1 * | 4/2004 | Gierkink et al. .............. | 331/46 |
| 2004/0251977 | A1 * | 12/2004 | Bellaouar et al. ........ | 331/117 R |
| 2008/0258827 | A1 * | 10/2008 | Tsai .................... | H03B 5/1228 |
| | | | | 331/117 R |
| 2008/0266007 | A1 * | 10/2008 | Tsai .................... | H03B 5/1228 |
| | | | | 331/117 FE |
| 2013/0135057 | A1 * | 5/2013 | Roithmeier ............. | 331/117 FE |

* cited by examiner

*Primary Examiner* — Richard Tan

(57) ABSTRACT

A circuit comprises an oscillator including a differential tank circuit, an oscillator carrier, and an active device. A phase difference between the oscillator carrier and a device current of the active device is adjusted to reduce upconversion of flicker noise of the oscillator. The circuit includes a common-mode reactance circuit configured to provide an intentionally introduced common-mode inductance, common-mode capacitance, or both, The common-mode reactance circuit is configured to adjust at common-mode impedance of the oscillator. A method comprises adjusting a phase difference between an oscillator carrier of an oscillator and a device current of an active device of the oscillator. The adjusted phase difference is selected to reduce upconversion of flicker noise generated in the oscillator. Adjusting the phase difference includes adjusting a common-mode impedance of the oscillator.

10 Claims, 13 Drawing Sheets

CIRCUITS AND METHODS FOR FLICKER NOISE UPCONVERSION MINIMIZATION IN AN OSCILLATOR

CROSS REFERENCES TO RELATED APPLICATIONS

This present disclosure claims the benefit of U.S. Provisional Application No. 61/884,580, filed on Sep. 30, 2013, U.S. Provisional Application No. 61/947,907, titled on Mar. 4, 2014, and U.S. Provisional Application No. 61/972,997, filed on Mar. 31, 2014, which are incorporated by reference herein in their entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior an against the present disclosure.

Flicker noise is generated by electronic devices. Flicker noise is also called 1/f noise, because the power spectral density of the noise is inversely proportional to frequency. Metal Oxide Semiconductor (MOS) devices made with sub-micron feature sizes, such as MOS devices fabricated on a 28 nm process, can generate substantial flicker noise at frequencies in the tenths of Megahertz or more.

An oscillator may be used to generate a carrier signal having a high carrier frequency. A non-linear operation of components within the oscillator may up-convert to low frequency noise present within the oscillator. The upconverted noise may produce phase noise in the carrier signal and may produce noise sick bands on either side of the carrier frequency.

Flicker noise is generated by different mechanisms than other types of noise in electronic devices, such as thermal noise and shot noise. As a result, techniques used to reduce other types of noise may be ineffective in reducing flicker noise.

SUMMARY

In an embodiment, a circuit comprises an oscillator including a differential tank circuit, an oscillator carrier, and an active device. A phase difference between the oscillator carrier and a device current of the active device is adjusted to reduce upconversion of flicker noise of the oscillator.

In an embodiment, the adjusted phase difference is substantially zero.

In an embodiment, adjusting the phase difference includes adjusting a common-mode impedance of the oscillator. In an embodiment, the adjusted common-mode impedance has a positive imaginary part at a second harmonic of a frequency of the oscillator carrier.

In an embodiment, the circuit includes a common-mode reactance circuit configured to provide an intentionally introduced common-mode inductance configured to adjust the common-mode impedance.

In an embodiment, the common-mode reactance circuit includes an active circuit connected to a common-mode port of the differential tank circuit.

In an embodiment, the common-mode reactance circuit includes an active circuit connected to first and second differential ports of the differential tank circuit.

In an embodiment, the circuit includes a common-mode reactance circuit configured to provide an intentionally introduced common-mode capacitance configured to adjust the common-mode impedance.

In an embodiment, the common-mode reactance circuit includes a variable capacitor connected between a common-mode port of the differential tank circuit and ground.

In an embodiment, the differential tank circuit includes first and second inductor filaments. The first inductor filament is inductively coupled to the second inductor filament and connected to the second inductor filament at a common-mode port, The circuit further comprises a reactive circuit connected to the common-mode port, wherein the reactive circuit is configured to adjust the phase difference to reduce upconversion of flicker noise of the oscillator.

In an embodiment, the oscillator is a current-biased oscillator.

In an embodiment, the oscillator is a voltage-biased oscillator.

In an embodiment, the circuit is provided in an integrated circuit.

In an embodiment, a method comprises adjusting a. phase difference between an oscillator carrier of an oscillator and a device current of an active device of the oscillator. The adjusted phase difference is selected to reduce upconversion of flicker noise generated in the oscillator.

In an embodiment, adjusting the phase difference includes minimizing the phase difference.

In an embodiment, adjusting the phase difference includes adjusting a common-mode impedance of the oscillator.

In an embodiment, the adjusted common-mode impedance of the oscillator has a positive imaginary part at a second harmonic of a frequency of the oscillator carrier.

In an embodiment, adjusting the common-mode impedance of the oscillator includes intentionally introducing a common-mode inductance or a common-mode capacitance into the oscillator, or both.

In an embodiment, adjusting the common-mode impedance of the oscillator includes using an active circuit to intentionally introducing a simulated common-mode inductance into the oscillator.

In an embodiment, adjusting the phase difference includes adjusting a common-mode resonance frequency of the oscillator to be slightly above a second harmonic of a frequency of the oscillator carrier.

DETAILED DESCRIPTION

Figure 1:
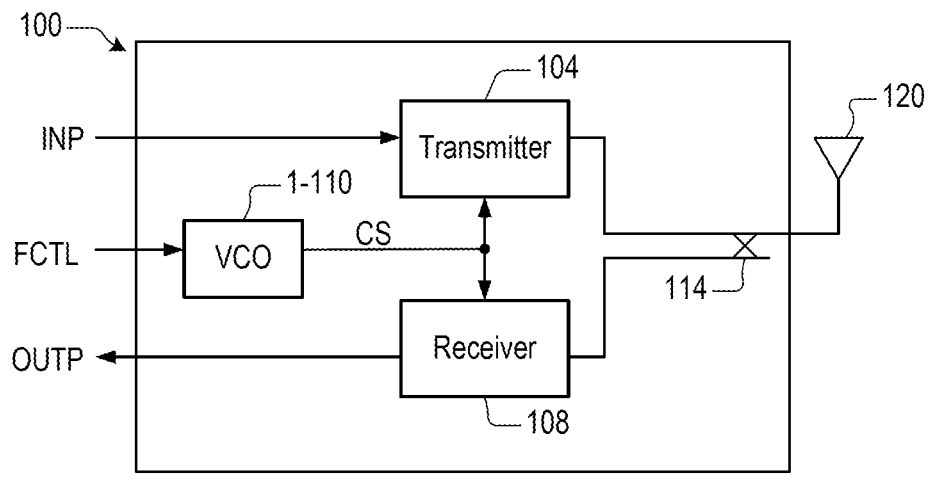
FIG. 1 illustrates a communication system including an oscillator according to an embodiment.

FIG. 1 illustrates a communication system 100 including a Voltage Controlled Oscillator (VCO) 1-110 according to an embodiment. The communication system 100 also includes a transmitter 104, a receiver 108, a duplexer 114, and an antenna 120. In an embodiment, the communication system 100 includes an integrated circuit chip within which the VCO 1-110 is disposed.

The VCO 1-110 supplies a carrier signal CS having a carrier frequency to the transmitter 104 and the receiver 108. The transmitter 104 uses a baseband input signal INP to modulate the carrier signal CS, amplifies the modulated signal, and transmits the amplified signal using the duplexer 114 and the antenna 120. The receiver 108 receives a signal using the antenna 120 and the duplexer 114, demodulates the received signal using the carrier signal CS, and produces a baseband output signal OUTP.

The carrier signal CS may include phase noise. Phase noise in the carrier signal CS causes jitter, which degrades the performance of the communication system 100. Sources of phase noise in the carrier signal CS include tank loss in a tank circuit of the VCO 1-110, power supply noise in a power supply connected to the VCO 1-110, and VCO core noise of the VCO 1-110. The VCO core noise is a low frequency flicker noise inherently generated by the active devices in the VCO 1-110.

Upconversion of the low-frequency VCO core noise to frequencies near the carrier frequency of the carrier signal CS introduces phase noise into the carrier signal CS. The VCO 1-110 operates to substantially eliminate the upconversion of the VCO core flicker noise by controlling a common-mode impedance of a differential tank circuit of the VCO 1-110.

Embodiments are described herein in terms of a voltage controlled oscillator, but embodiments are not limited thereto. Embodiments of the present disclosure may include any oscillator employing a differential tank circuit.

Figure 2:
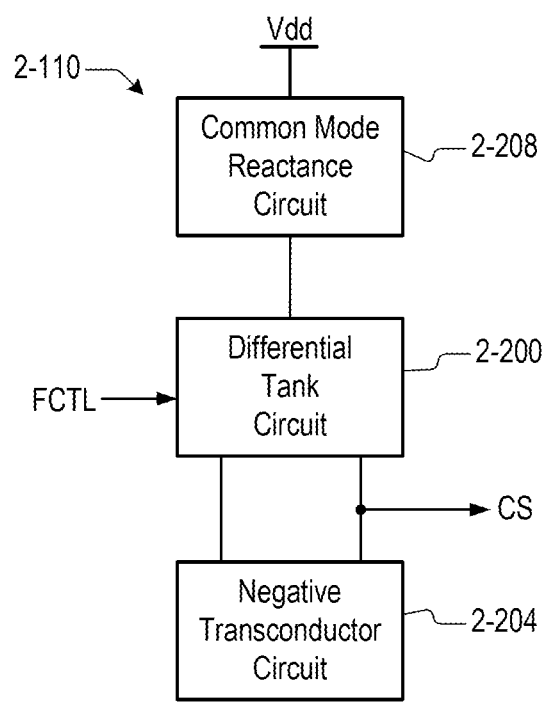
FIG. 2 is a diagram of an oscillator according to an embodiment.

FIG. 2 is a diagram of a VCO 2-110 according to an embodiment. The VCO 2-110 includes a differential tank circuit 2-200, a negative transconductor circuit 2-204, and a common-mode reactance circuit 2-208. A differential resonant frequency of the differential tank circuit 2-200 is adjusted according to a frequency control signal FCTL. The frequency control signal FCTL may be an analog signal or a multi-bit digital signal.

The negative transconductor circuit 2-204 is coupled to opposite ends of the differential tank circuit 2-200. The negative transconductor circuit 2-204 sources and sinks current in order to sustain the oscillation of the differential tank circuit 2-200.

A carrier signal CS is produced on one end of the differential tank circuit 2-200. The carrier signal CS has a carrier frequency substantially equal to the differential resonant frequency of the differential tank circuit 2-200. In an embodiment, a complementary carrier signal having a phase opposite to that of the carrier signal CS is produced on the other end of the differential tank circuit 2-200.

The common-mode reactance circuit 2-208 introduces a common-mode reactance in the differential tank circuit 2-200. A value of the common-mode reactance is selected so as to reduce or substantially eliminate upconversion of flicker noise b the negative transconductor circuit 2-204.

In an embodiment, the common-mode reactance circuit 2-208 produces a common-mode reactance in the differential tank circuit 2-200 that has a positive, imaginary part at a second harmonic of the carrier frequency. In an embodiment, the common-mode reactance circuit 2-208 produces a common-mode reactance in the differential tank circuit 2-200 that substantially eliminates a phase lag, relative to the carrier signal CS, in a device current in the negative transconductor circuit 2-204.

Figure 3A:
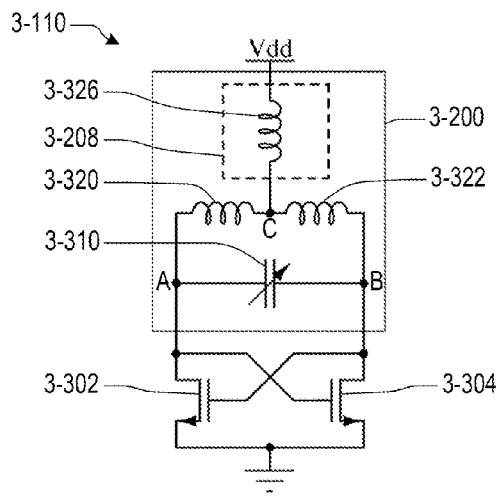
FIG. 3A is a schematic of an oscillator according to an embodiment.

FIG. 3A is a schematic of a VCO 3-110 according to an embodiment, The VCO 3-110 includes a differential tank circuit 3-200. The VCO 3-110 also includes a negative transconductance circuit formed by first and second N-channel MOS (NMOS) transistors 3-302 and 3-304.

Sources of the first and second NMOS transistors 3-302 and 3-304 are connected to ground. A drain of the first NMOS transistor 3-302 is connected to a first differential port A of the differential tank circuit 3-200 and to a gate of the second NMOS transistor 3-304. A drain of the second NMOS transistor 3-304 is connected to a second differential port B of the differential tank circuit 3-200 and to a gate of the first NMOS transistor 3-302.

The differential tank circuit 3-200 includes a variable capacitor 3-310, first and second inductor filaments 3-320 and 3-322, and a common-mode reactance circuit 3-208. A first terminal of the variable capacitor 3-310 is connected to the first differential port A of the differential tank circuit 3-200 and to a first terminal of the first inductor filament 3-320. A second terminal of the variable capacitor 3-310 is connected to the second differential port B of the differential tank circuit 3-200 and to a first terminal of the second inductor filament 3-322.

In an embodiment, variable capacitor 3-310 includes a Capacitor Digital To Analog Converter (CDAC) including a plurality of capacitors coupled to a plurality of switching devices. In an embodiment, variable capacitor 3-310 includes a variable capacitance diode (varactor). In an embodiment, variable capacitor 3-310 includes a Micro-Electro-Mechanical System (MEMS) variable capacitor.

A second terminal of the first inductor filament 3-320 and a second terminal of the second inductor filament 3-322 are connected to a common-mode port C of the differential tank circuit 3-200. A first terminal of the common-mode reactance circuit 3-208 is connected to the common-mode port C. A second terminal of the common-mode reactance circuit 3-208 is connected to the supply voltage Vdd. A common-mode inductor 3-326 is coupled between the first and second terminals of the common-mode reactance circuit 3-208.

Figure 3B:
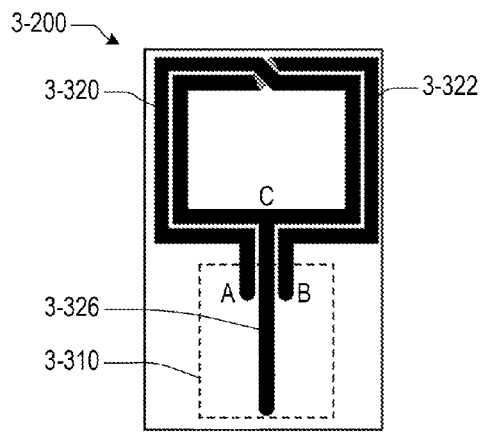
FIG. 3B shows a layout of components of the oscillator of FIG. 3A according to an embodiment.

FIG. 3B shows a plan view of the layout of components of the differential tank circuit 3-200 of VCO 3-110 on a semiconductor die according to an embodiment. The dashed rectangle indicates a region containing the variable capacitor 3-310.

The first inductor filament 3-320 is disposed in one or more layers above the variable capacitor 3-310 and is connected to the variable capacitor 3-310 at the first differential port A. Starting from the first differential port A, the first inductor filament 3-320 is disposed in a clockwise circular fashion to connect with the common-mode port C.

The second inductor filament 3-322 is disposed in one or more layers above the variable capacitor 3-310 and is connected to the variable capacitor 3-310 at the second differential port B. Starting from the second differential port B, the second inductor filament 3-322 is disposed in a counter-clockwise circular fashion to connect with the common-mode port C. The second inductor filament 3-322 is disposed adjacent to the first inductor filament 3-320 and is inductively coupled to the first inductor filament 3-320.

A first terminal of the common-mode inductor 3-326 is connected to the common-mode port C. The common-mode inductor 3-326 is disposed over the region containing the variable capacitor 3-310. A second terminal of the common-mode inductor 3-326 that is distal to the first terminal of the common-mode inductor 3-326 is connected to the supply voltage Vdd (not shown). Because the common-mode inductor 3-326 is disposed over the area occupied by the variable capacitor 3-310, the addition of the common-mode inductor 3-326 does not increase the planar size of the VCO 3-110.

Figure 3C:
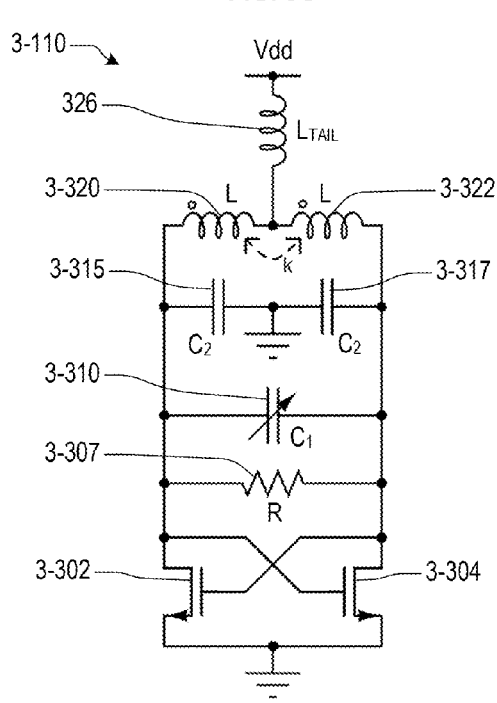
FIG. 3C shows an equivalent circuit of the oscillator of FIG. 3A.

FIG. 3C shows an equivalent circuit of the VCO 3-110 of FIG. 3A. Components having the same reference characters as components in FIG. 3A are idealized representations of the corresponding components of FIG. 3A. The variable capacitor 3-310 in FIG. 3C corresponds to a differential capacitance $C_1$ of the VCO 3-110. First and second inductor filaments 3-320 and 3-322 each correspond to a differential inductance L of the VCO 3-110, and k is the coupling factor between the first and second inductor filaments 3-320 and 3-322. A common-mode inductor 3-326 corresponds to an intentionally introduced common-mode inductance $L_{TAIL}$ of the VCO 3-110.

First and second common-mode capacitors 3-315 and 3-317 represent inherent common-mode capacitances $C_2$ of the VCO 3-110, including the common-mode capacitances of the variable capacitor 3-310, first and second NMOS transistors 3-302 and 3-304, and first and second inductor filaments 3-320 and 3-322. A resistor 3-307 represents a tank loss having a resistance R.

The first and second NMOS transistors 3-302 and 3-304 each generate flicker noise proportional to the respective device currents flowing through each. The device currents change periodically over the oscillation cycle of the VCO 3-110, and therefore the flicker noise also changes periodically, that it, the flicker noise is cyclostationary. The flicker noise $i_n$ can therefore be modeled as a noise source that produces an ungated noise current $i_{ns}$ that is modified by a gating function P(t), as shown in Equation 1, below, wherein $i_{ns}$ is stationary (that is, does not vary cyclically) and P(t) is periodic with a period $T=2\pi/\omega_0$, where $\omega_0$ is a differential-mode resonant frequency (that is, an oscillator carrier) of the VCO 3-110.

$$i_n = P(t) \cdot i_{ns} \qquad \text{Equation 1}$$

Because the gating function P(t) is periodic, it can be expanded into a Fourier series, as shown in Equation 2, below, wherein $c_i$ is a magnitude coefficient of the $i^{th}$ harmonic and $\phi_i$ is a phase shift of the $i^{th}$ harmonic.

$$P(t) = c_0 + \sum_{k=1}^{\infty} c_k \cdot \sin(k \cdot \omega_0 \cdot t + \varphi_k) \qquad \text{Equation 2}$$

By restricting the Fourier expansion of the gating function P(t) to the first harmonic and considering only the upper sideband terms, the single-sideband phase noise PN may be approximated using Equation 3, wherein the term $(a_n^2/2$ represents the Root-Mean-Square (RAS) current density of the flicker noise, $A_1$ represents a carrier amplitude, and $C_{DM}$ represents a total differential-mode capacitance.

$$PN = \frac{\left(\frac{a_n^2}{2}\right) \cdot c_1^2 \cdot \sin^2 \varphi_1}{8 \cdot C_{DM}^2 \cdot A_1^2 \cdot \Delta \omega^2} \qquad \text{Equation 3}$$

The RMS current density of the flicker noise of an active device can be approximated using Equation 4, where $K_{1/f}$ is as constant that depends on the properties and biasing conditions of the active device.

$$\left(\frac{a_n^2}{2}\right) \cong \frac{2\pi \cdot K_{1/f}}{\Delta \omega} \qquad \text{Equation 4}$$

In the VCO 3-110, the active devices include the first and second NMOS transistors 3-302 and 3-304.

Substituting the right side of Equation 4 into Equation 3 produces Equation 5:

$$PN \cong \frac{\pi \cdot K_{1/f} \cdot c_1^2 \cdot \sin^2 \varphi_1}{4 \cdot C_{DM}^2 \cdot A_1^2 \cdot \Delta \omega^3} \qquad \text{Equation 5}$$

Of particular interest in Equation 5 is the $\sin^2 \phi_1$ term. The $\phi_1$ term represents the phase difference between the first harmonic of the gating function P(t) and the oscillator carrier $\omega_0$. Equation 5 reveals that the phase noise produced by upconversion depends on the phase difference between the first harmonic of the gating function P(t) and the oscillator carrier $\omega_0$.

In MOS devices, the gating function P(t) can be assumed to be in phase with the device current through the device. Accordingly, Equation 5 reveals that the upconversion of active device flicker noise depends on the phase shift $\phi_1$ between the oscillator carrier and the device current in the flicker noise injecting device, and reveals that when the device current is in phase with the oscillator carrier $\omega_0$ ($\phi_1=0$), flicker noise upconversion is minimized.

In the VCO 3-110, the phase shift $\phi_{DM}$ by which the differential-mode current lags the differential voltage can be approximated by Equation 6, wherein Q represents a tank quality factor of the VCO 3-110 and $g_1$ represents a linear component of the transconductance of the first and second NMOS transistors 3-302 and 3-304.

$$\varphi_{DM} \cong \frac{-R}{8 \cdot \omega_0 \cdot C_{DM}}(g_1 - 1/R)^2 = -\frac{(g_1 \cdot R - 1)^2}{8 \cdot Q} \quad \text{Equation 6}$$

In the VCO 3-110, the common-mode operation affects the phase shift between the differential-mode current and the respective drain voltages of the first and second NMOS transistors 3-302 and 3-304 by $\phi_{CM}$ and can be approximated by Equation 7, wherein $Z_i$ is an imaginary component of the common-mode impedance of the VCO 3-110 at the second harmonic of the oscillator carrier $\omega_0$, and wherein $f_2$ and $g_3$ represent a second and third order non-linearity, respectively, of the transconductance of the first and second NMOS transistors 3-302 and 3-304.

$$\varphi_{CM} \cong \frac{2g_2^2}{3g_3}(g_1 \cdot R - 1)Z_i \quad \text{Equation 7}$$

The common-mode operation therefore advances or retards the phase shift of the differential-mode current relative to the respective drain voltages of the first and second NMOS transistors 3-302 and 3-304 depending on the sign of the imaginary part $Z_i$ of the common-mode impedance of the VCO 3-110 at the second harmonic. For $Z_i>0$ it advances the differential-mode current relative to the respective drain voltages, while for $Z_i<0$ it retards the differential-mode current relative to the respective drain voltages.

A total phase shift $\phi_1$ between the oscillator carrier and the active device current can be approximated by the sum of Equations 6 and 7, as shown in Equation 8. Equation 8 shows that the total phase shift $\phi_1$ depends on the one hand on the oscillator odd-order nonlinearity and on the other hand on the oscillator even-order nonlinearity in conjunction with the imaginary part $Z_i$ of the common-mode tank impedance at the second harmonic.

$$\varphi_1 = \varphi_{DM} + \varphi_{CM} \cong -\frac{(g_1 \cdot R - 1)^2}{8 \cdot Q} + \frac{2g_2^2}{3g_3}(g_1 \cdot R - 1)Z_i \quad \text{Equation 8}$$

The first term of Equation 8 is always negative. As the imaginary part $Z_i$ of the common-mode impedance of the VCO 3-110 at the second harmonic of the oscillator carrier to $\omega_0$ becomes positive, the second term in of Equation 8 becomes positive as well and can thus compensate for the negative first term. Embodiments having proper design of the common-mode impedance of the tank at the second harmonic of the oscillator carrier $\omega_0$ operate to minimize or substantially eliminate the total phase shift $\phi_1$ between the oscillator carrier $\omega_0$ and the device current, thereby minimizing the upconversion of flicker noise.

For the VCO 3-110, a total common-mode capacitance $C_{CM}$, a total differential-mode capacitance $C_{DM}$, a total common-mode inductance $L_{CM}$, a total differential-mode inductance $L_{DM}$, and a common-mode resonance frequency $\omega_{CM}$ may be determined using Equations 9 through 13, respectively:

$$C_{CM} = 2 \cdot C_2 \quad \text{Equation 9}$$

$$C_{DM} = C_1 + C_2/2 \quad \text{Equation 10}$$

$$L_{CM} = (L/2) \cdot (1-k) + L_{TAIL} \quad \text{Equation 11}$$

$$L_{DM} = 2 \cdot L \cdot (1+k) \quad \text{Equation 12}$$

$$\omega_{CM} = \frac{1}{\sqrt{L_{CM} \cdot C_{CM}}} \quad \text{Equation 13}$$

Figure 4A:
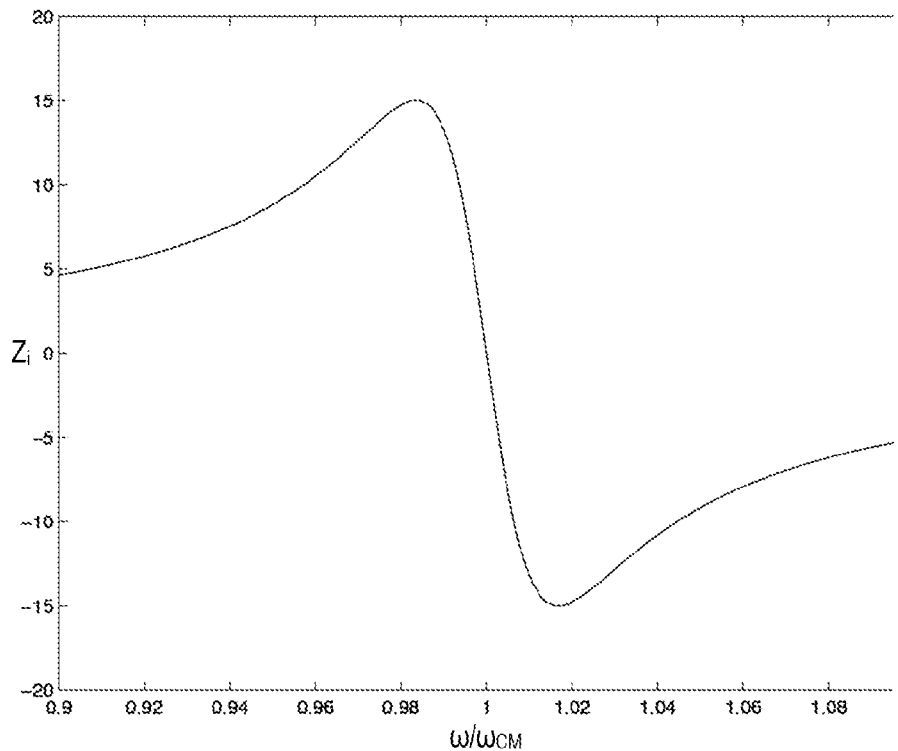
FIGS. 4A and 4B are graphs showing impedances of the oscillator of FIG. 3A according to embodiments.

For a given common-mode resistance $R_{CM}$, the imaginary component $Z_i$ of the common-mode impedance of the VCO 3-110 at a frequency $\omega$ may be determined using Equation 14, and is shown in FIG. 4A.

$$Z_i = \frac{\omega \cdot R_{CM}^2 \cdot L_{CM} \cdot [1 - (\omega/\omega_{CM})^2]}{R_{CM}^2 \cdot [1 - (\omega/\omega_{CM})^2]^2 + (\omega \cdot L_{CM})^2} \quad \text{Equation 14}$$

As seen in FIG. 4A, the imaginary component $Z_i$ of the common-mode impedance becomes negative for frequencies $\omega$ higher than the common-mode resonant frequency $\omega_{CM}$.

As shown in Equations 11 and 13, the total common-mode inductance $L_{CM}$ is a function of an intentionally introduced common-mode inductance $L_{TAIL}$ and the common-mode resonant frequency $\omega_{CM}$ is a function of the total common-mode inductance $L_{CM}$. Therefore, by using a pre-determined value to the intentionally introduced common-mode inductance $L_{TAIL}$, the common-mode resonant frequency $\omega_{CM}$ can be placed slightly above the second harmonic of the oscillator carrier $\omega_0$. This causes the imaginary component $Z_i$ of the common-mode impedance to be slightly positive at the second harmonic of the oscillator carrier $\omega_0$, which reduces or substantially eliminates the total phase shift $\phi_1$ between the oscillator carrier $\omega_0$ and the device current, as shown by Equation 8. Minimizing the total phase shift $\phi_1$ minimizes the upconversion of flicker noise, as shown by Equation 5.

Figure 4B:
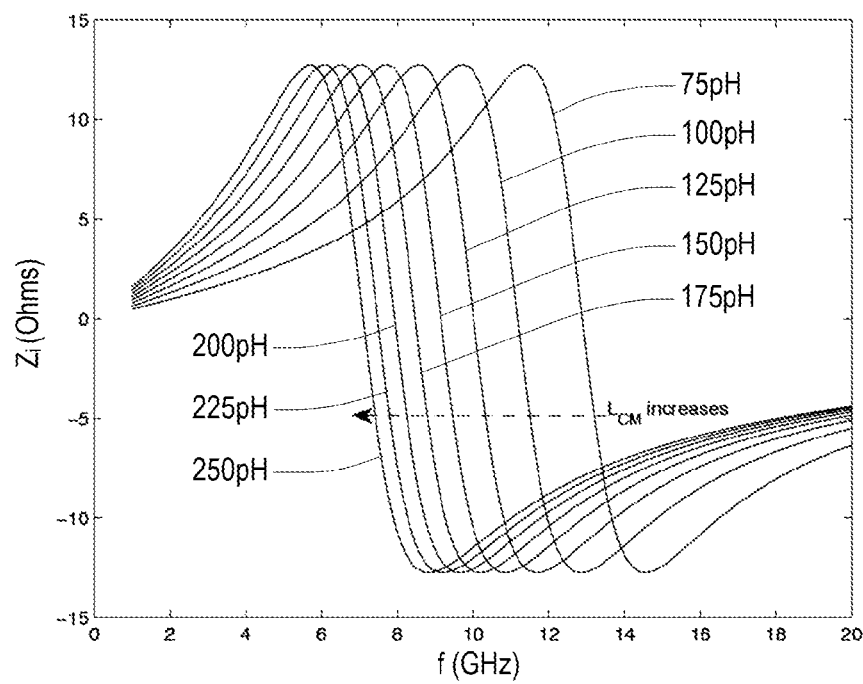

FIG. 4B shows how the imaginary component $Z_i$ of the common-mode impedance varies in an embodiment according to the value of the common-mode inductance $L_{CM}$ and frequency. In the embodiment, the oscillator carrier $\omega_0$ has a frequency of 5 GHz. In the embodiment, the imaginary component $Z_i$ of the common-mode impedance becomes negative at the second harmonic of the oscillator carrier $\omega_0$, starting at a value of around 125 picoHenries (pH) for the common-mode inductance $L_{CM}$.

Figure 4C:
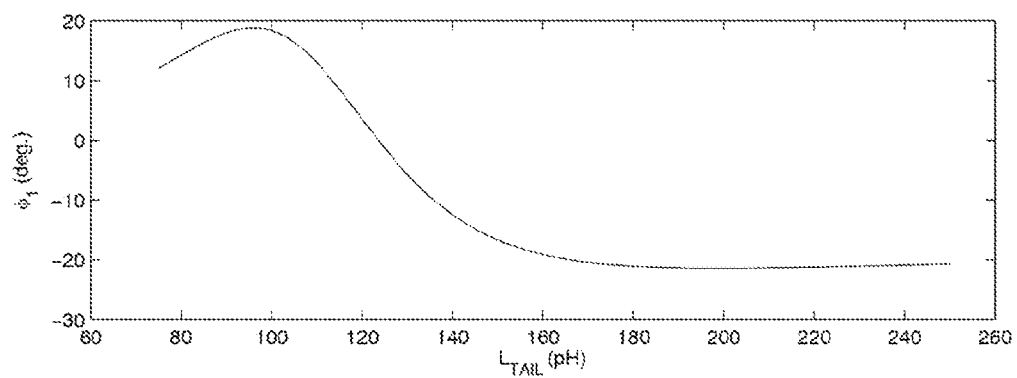
FIGS. 4C and 4D are graphs showing a phase angle and a phase noise, respectively, of the oscillator of FIG. 3A according to embodiments.
Figure 4D:
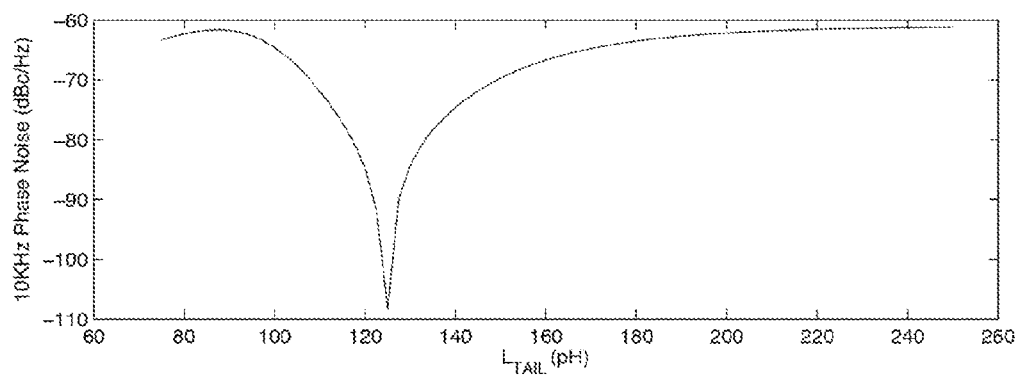

FIG. 4C shows the total phase shift $\phi_1$ between the oscillator carrier $\omega_0$ and the device current for different values of the intentionally introduced common-mode inductance $L_{TAIL}$ in an embodiment. FIG. 4C shows that the total phase shift $\phi_1$ is approximately zero degrees at a value of around 125 pH for the common-mode inductance $L_{TAIL}$. FIG. 4D shows the flicker noise upconversion for the embodiment, and shows that the flicker noise upconversion is substantially reduced at a value of around 125 pH for the common-mode inductance $L_{TAIL}$.

Note that because some of the equations above are approximations, the optimal value for the total phase shift $\phi_1$ may be slightly offset from zero. In particular, because charge injection into the tank circuit 3-200 of the VCO 3-110 creates a voltage change not precisely in phase with the voltage across variable capacitor 3-310, the optimal value for the total phase shift $\phi_1$ may have an offset from zero of a phase shift $\theta$ that may be calculated using Equation 15, below. A person of skill in the art in light of the teachings and disclosures herein would understand how to account for the phase shift $\theta$ in determining the common-mode impedance and the common-mode resonant frequency of the VCO 3-110.

$$\vartheta = -\frac{g_1 \cdot R - 1}{4 \cdot Q} \quad \text{Equation 15}$$

Figure 3D:
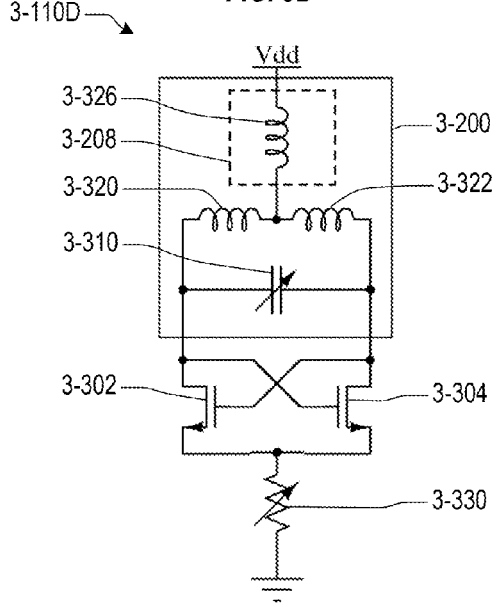
FIG. 3D is a schematic of a variant of the oscillator of FIG. 3A according to an embodiment.

FIG. 3D shows a VCO 3-110D that is a variation of the VCO 3-110 of FIG. 3A, in which a variable resistor 3-330 is connected between the sources of the first and second NMOS transistors 3-302 and 3-304 and ground. The variable resistor 3-330 may be used to control the bias current of the first and second NMOS transistors 3-302 and 3-304. Altering the resistance value of the variable, resistor 3-330 produces a change in the common-mode resistance $R_{CM}$ of the VCO 3-110D, and thereby provides a mechanism for adjusting the value of the imaginary component $Z_i$ of the common-mode impedance of the VCO 3-110D, as shown in Equation 14, to further optimize the reduction of the upconverted flicker noise.

Figure 5A:
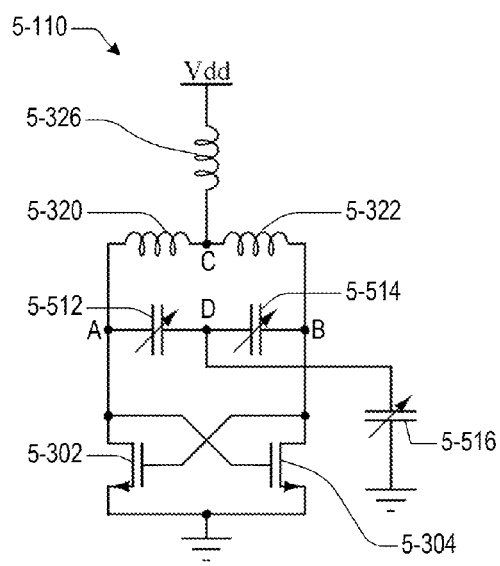
FIG. 5A is a schematic of an oscillator according to another embodiment.

FIG. 5A is a schematic of a VCO 5-110 according to another embodiment. The VCO 5-110 differs from the VCO 3-110 of FIG. 3A by using, in addition to a common-mode inductor 5-326, a variable capacitor 5-516 to control the common-mode impedance of the VCO 5-110.

Sources of first and second NMOS transistors 5-302 and 5-304 are connected to ground. A drain of the first NMOS transistor 5-302 is connected to a first differential port A and to a gate of the second NMOS transistor 5-304. A drain of the second. NMOS transistor 5-304 is connected to a second differential port B and to a gate of the first NMOS transistor 5-302.

A differential tank circuit includes first and second variable capacitors 5-512 and 5-514 and first and second inductor filaments 5-320 and 5-322. A first terminal of the first variable capacitor 5-512 is connected to a first differential port A and to a first terminal of the first inductor filament 5-320. A first terminal of the second variable capacitors 5-514 is connected to the second differential port B and to a first terminal of the second inductor filament 5-322. Second terminals of the first and second variable capacitors 5-512 and 5-514 are connected to a second common-mode port D. Second terminals of the first and second inductor filaments 5-320 and 5-322 are each connected to a first common-mode port C.

A first terminal of a common-mode inductor 5-326 is connected to the first common-mode port C. second terminal of the common-mode inductor 5-326 is connected to the supply voltage Vdd. A first terminal of the common-mode variable capacitor 5-516 is connected to the second common-mode port D. A second terminal of the common-mode variable capacitor 5-516 is connected to ground.

In an embodiment, the first and second variable capacitors 5-512 and 5-514 and the common-mode variable capacitor 5-516 each includes one or more of a CDAC, a varactor, and a MEMS variable capacitor.

Figure 5B:
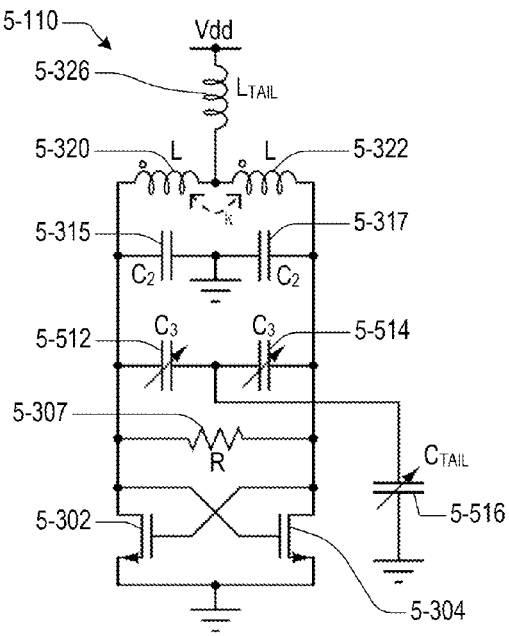
FIG. 5B shows an equivalent circuit of the oscillator of FIG. 5A.

FIG. 5B shows an equivalent circuit of the VCO 5-110 of FIG. 5A. Components having the same reference characters as components in FIG. 5A are idealized representations of the corresponding components of FIG. 5A. The first and second variable capacitors 5-512 and 5-514 in FIG. 5B each correspond to a differential capacitance $C_3$ of the VCO 5-110. First and second inductor filaments 5-320 and 5-322 each correspond to a differential inductance L of the VCO 5-110, and k is the coupling factor between the first and second inductor filaments 5-320 and 5-322. A common-mode inductor 5-326 corresponds to an intentionally introduced common-mode inductance $L_{TAIL}$ of the VCO 5-110. A common-mode variable capacitor 5-516 corresponds to an intentionally introduced common-mode capacitance $C_{TAIL}$ of the VCO 5-110.

First and second common-mode capacitors 5-315 and 5-317 represent inherent common-mode capacitances $C_2$ of the VCO 5-110, including the common-mode capacitances of the first and second variable capacitors 5-512 and 5-514, first and second NMOS transistors 5-302 and 5-304, and first and second inductor filaments 5-320 and 5-322. A resistor 5-307 represents a tank loss having a resistance R.

A common-mode capacitance $C_{CM}$ and a differential-mode capacitance $C_{DM}$ of VCO 5-110 may be determined using Equations 16A and 16B below, respectively.

$$C_{CM} = 2 \cdot C_2 + \frac{1}{\frac{1}{2 \cdot C_3} + \frac{1}{C_{TAIL}}} \quad \text{Equation 16A}$$

$$C_{DM} = \frac{C_3}{2} + \frac{C_2}{2} \quad \text{Equation 16B}$$

A common-mode inductance $L_{CM}$, a differential-mode inductance $L_{DM}$, a common-mode resonance frequency $\omega_{CM}$, and an imaginary component $Z_i$ of the common-mode impedance of VCO 5-110 may then be determined using Equations 11 through 14, above, respectively.

By using a predetermined value for the intentionally introduced common-mode inductance $L_{TAIL}$ and providing an appropriate common-mode capacitance $C_{TAIL}$ using the common-mode variable capacitor 5-516, the common-mode resonant frequency $\omega_{CM}$ can be placed slightly above the second harmonic of the oscillator carrier $\omega_0$. This causes the imaginary component $Z_i$ of the common-mode impedance to be slightly positive at the second harmonic of the oscillator carrier $\omega_0$, which reduces or substantially eliminates the total phase shift $\phi_1$ between the oscillator carrier $\omega_0$ and the device current, as shown by Equation 8. Minimizing the total phase shift $\phi_1$ minimizes the upconversion of flicker noise, as shown try Equation 5.

Figure 6A:
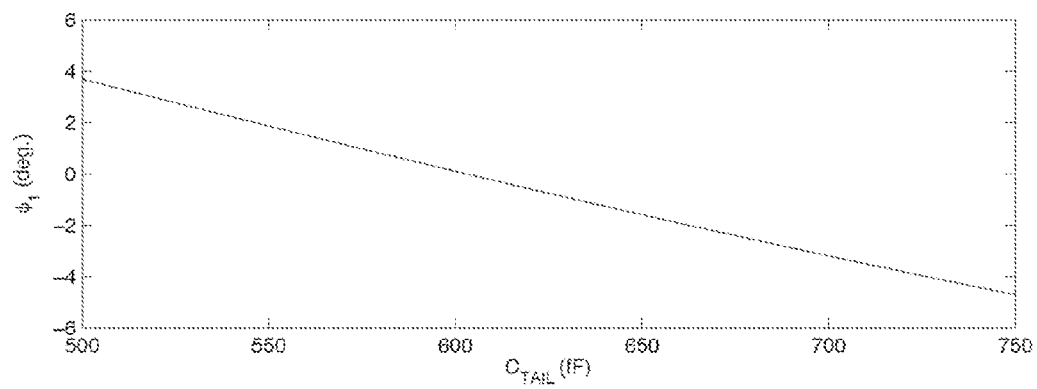
FIGS. 6A and 6B are graphs showing a phase angle and a phase noise, respectively, of the oscillator of FIG. 5A according to embodiments.
Figure 6B:
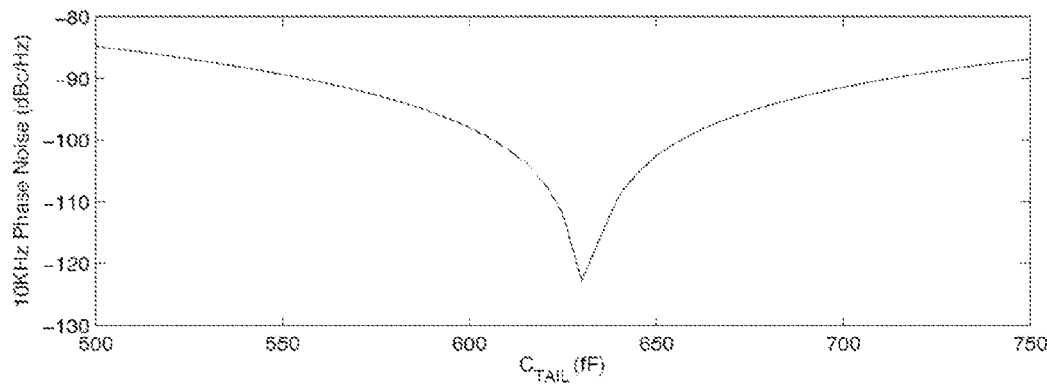

FIG. 6A is a graph showing a phase angle of the oscillator of FIG. 5A according to embodiments. FIG. 6B is a graph showing, a phase noise at a 10 KHz frequency offset of the oscillator of FIG. 5A according to the embodiments. In the embodiments, the intentionally introduced common-mode inductance $L_{TAIL}$ is 100 pH and the common-mode capacitance $C_{TAIL}$ is varied from 500 femtoFarads (fF) to 750 fF.

FIG. 6A shows that the total phase shift $\phi_1$ between the oscillator carrier and the device current approaches zero degrees at a value for $C_{TAIL}$ of approximately 630 fF. FIG. 6B shows that the 10 KHz phase noise is at a minimum when the total phase shift $\phi_1$ is in the vicinity of zero degrees.

Although FIG. 5A shows a VCO 5-110 including the common-mode inductor 5-326, embodiments are not limited thereto. When an adequate amount of common-mode inductance already exists in an embodiment, the common-mode variable capacitor 5-516 ma be sufficient to produce the desired total phase shift $\phi_1$. In particular, when a single turn inductor is used to provide the differential inductance L and the magnetic coupling factor k is very small, the tank common-mode inductance may approach a value of L/2 without the use of the common-mode inductor 5-326, and therefore the common-mode inductor 5-326 may be omitted.

Figure 5C:
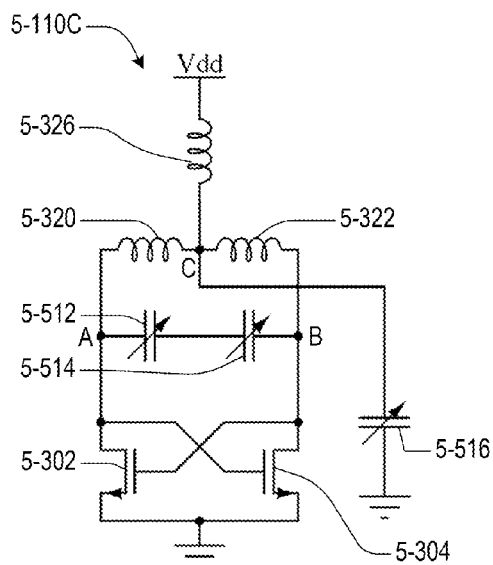
FIGS. 5C and 5D are schematics of variants of the oscillator of FIG. 5A according to embodiments.

FIG. 5C shows a VCO 5-110C, which is a variation of the VCO 5-110 of FIG. 5A. The VCO 5-110C differs from the VCO 5-110 in that the common-mode variable capacitor 5-516 is connected to the first common-mode port C. Therefore the common-mode capacitance $C_{CM}$ is given by Equation 16C wherein $C_{TAIL}$ is the capacitance of the common-mode capacitor 5-516 and $C_2$ is the capacitance of each of the inherent common-mode capacitances of the VCO 5-110C, shown as first and second common-mode capacitors 5-315 and 5-317 in FIG. 5B.

$$C_{CM} = C_{TAIL} + 2 \cdot C_2 \qquad \text{Equation 16C}$$

A common-mode inductance $L_{CM}$, a differential-mode inductance $L_{DM}$, a common-mode resonance frequency $\omega_{CM}$, an imaginary component $Z_i$ of the common-mode impedance, and a differential-mode capacitance $C_{DM}$ of the VCO 5-110C may then be determined using Equations 11, 12, 13, 14, and 16B, above, respectively.

As with the VCO 5-110 of FIG. 5A, when an adequate amount of inherent common-mode inductance already exists in an embodiment of VCO 5-110C, the common-mode variable capacitor 5-516 may be sufficient to produce the desired total phase shift $\phi_1$, and the common-mode inductor 5-326 may be omitted.

Figure 5D:
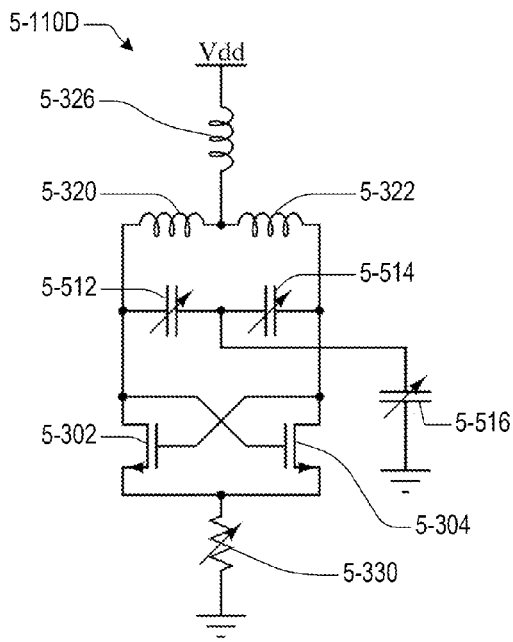

FIG 5D shows a VCO 5-110D that is another variation of the VCO 5-110 of FIG. 5A, in which a variable resistor 5-330 is connected between the sources of the first and second NMOS transistors 5-302 and 5-304 and ground. The variable resistor 5-330 may be used to control the bias current of the first and second NMOS transistors 5-302 and 5-304. Altering the resistance value of the variable resistor 5-330 produces a change in the common-mode resistance $R_{CM}$ of the VCO 5-110D, and thereby provides a mechanism for adjusting the value of the imaginary component $Z_i$ of the common-mode impedance of the VCO 5-110D, as shown in Equation 14, to further optimize the reduction of the upconverted flicker noise.

Figure 7A:
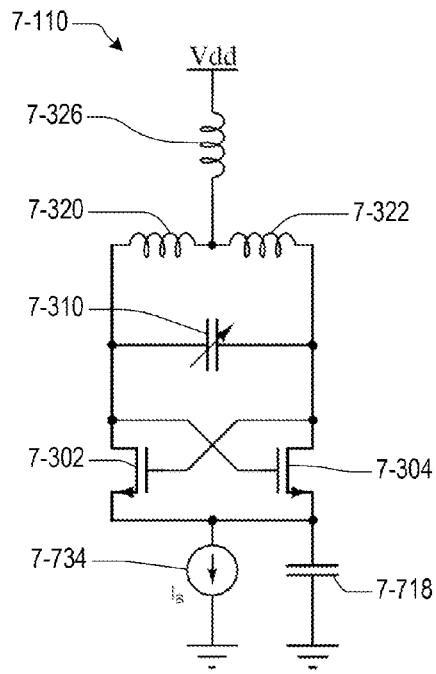
FIG. 7A is a schematic of a current-biased oscillator according to an embodiment.

FIG. 7A is a schematic of a VCO 7-110 according to another embodiment. The VCO 7-110 is a current biased VCO, and differs from the VCO 3-110 of FIG. 3A by having a constant current source 7-734 connected between the sources of the first and second NMOS transistors 7-302 and 7-304 and ground. A bypass capacitor 7-718 is connected across the constant current source 7-734. In an embodiment, the bypass capacitor 7-718 has to capacitance of 5 picofarads (pF).

Figure 7B:
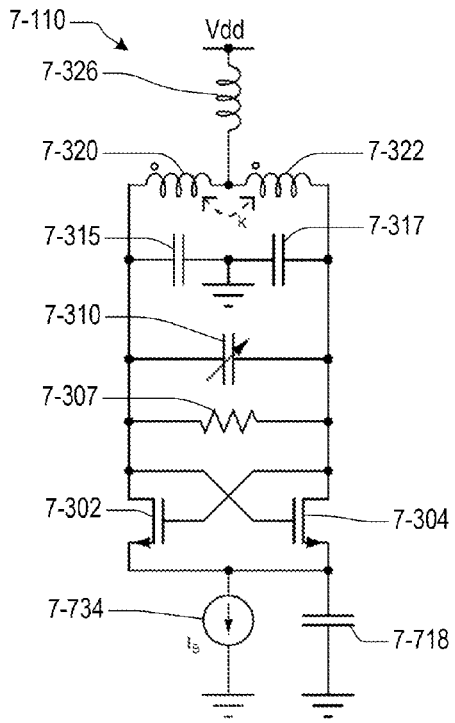
FIG. 7B is an equivalent circuit of the oscillator of FIG. 7A.

FIG. 7B is an equivalent circuit for the VCO 7-110, in which components having the same reference characters as components in FIG. 7A represent idealized versions of the latter components, respectively. First and second common-mode capacitors 7-315 and 7-317 represent inherent common-mode capacitances of the VCO 7-110, including the common-mode capacitances of the variable capacitor 7-310, first and second NMOS transistors 7-302 and 7-304, and first and second inductor filaments 7-320 and 7-322. A resistor 3-307 represents a tank loss having a resistance R. A value k represents the coupling factor between the first and second inductor filaments 3-320 and 3-322.

In the VCO 7-110, the oscillator current $I_B$ is set by the constant current source 7-734. The bypass capacitor 7-718 acts as a short at high frequencies, so that at high frequencies the topology of the VCO 7-110 is substantially identical to the topology of the VCO 3-110 of FIG. 3A. As a result, the VCO 7-110 operates to prevent upconversion noise in the same manner as the VCO 3-110, as described above, by using the common-mode inductor 7-326 to cause a common-mode resonance frequency of the VCO 7-110 to be slightly higher than a second harmonic of the oscillator carrier and to cause an imaginary part $Z_i$ of a common-mode impedance to have a positive value at the second harmonic of the oscillator carrier.

Figure 8A:
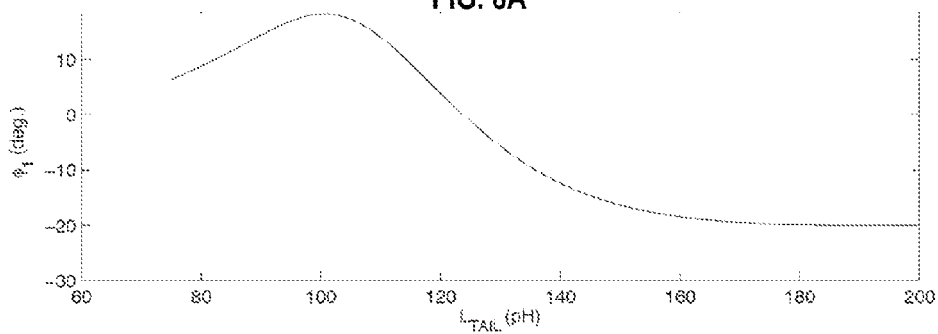
FIGS. 8A and 8B are graphs showing a phase angle and a phase noise, respectively, of the oscillator of FIG. 7A according to embodiments.
Figure 8B:
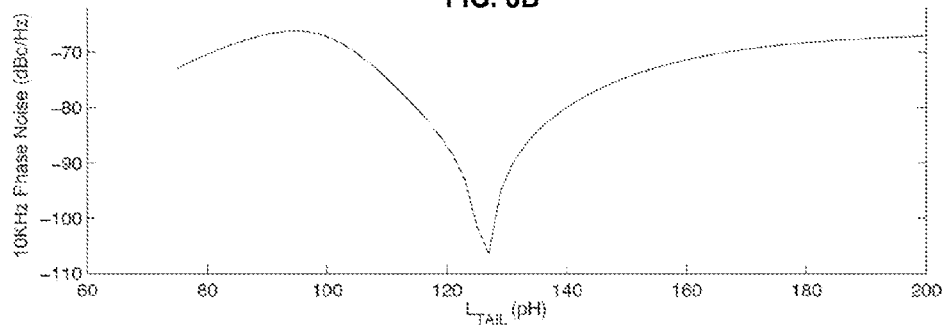

FIG. 8A shows a total phase shift $\phi_1$ between the oscillator carrier and an active device current in the first or second NMOS transistor 7-302 and 7-304 for various values of the inductance $L_{TAIL}$ of the common-mode inductor 7-326. FIG. 8B shows a phase noise at 10 KHz in the VCO 7-110 due to flicker noise in the first and second NMOS transistors 7-302 and 7-304 for various values of the inductance $L_{TAIL}$ of the common-mode inductor 7-326. As can be seen front the graphs, the total phase shift $\phi_1$ approaches zero when the inductance $L_{TAIL}$ is approximately 125 pH, and the phase noise at 10 KHz is minimized as the total phase shift $\phi_1$ approaches zero.

Figure 8C:
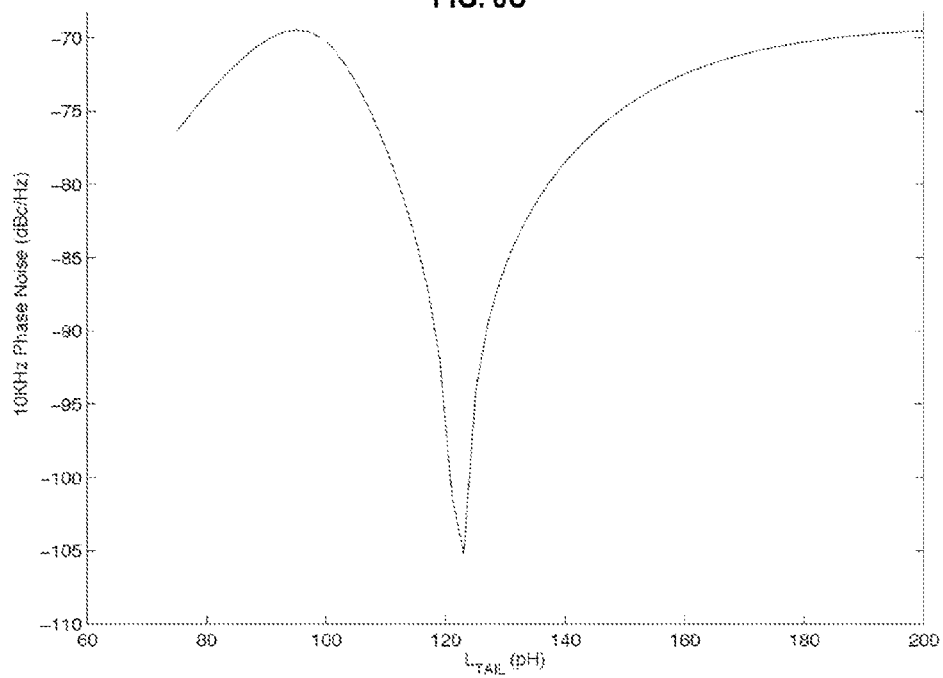
FIG. 8C is a graph showing a phase noise due to a constant current source of the oscillator of FIG. 7A according to embodiments.

In a conventional current-biased oscillator, flicker noise from the constant current source used to bias the oscillator is upconverted around the oscillator carrier and creates phase noise. FIG. 8C shows a phase noise due to upconverted flicker noise of the constant current source 7-734 of VCO 7-110 for various values of the inductance $L_{TAIL}$. Because the process that upconverts the flicker noise of the constant current source 7-734 is similar to the process that upconverts the flicker noise of the first and second NMOS transistor 7-302 and 7-304, the phase noise due to upconverted flicker noise of the constant current source 7-734 is minimized at substantially the same value of $L_{TAIL}$ that minimizes the upconverted flicker noise of the first and second NMOS transistors 7-302 and 7-304.

Figure 9:
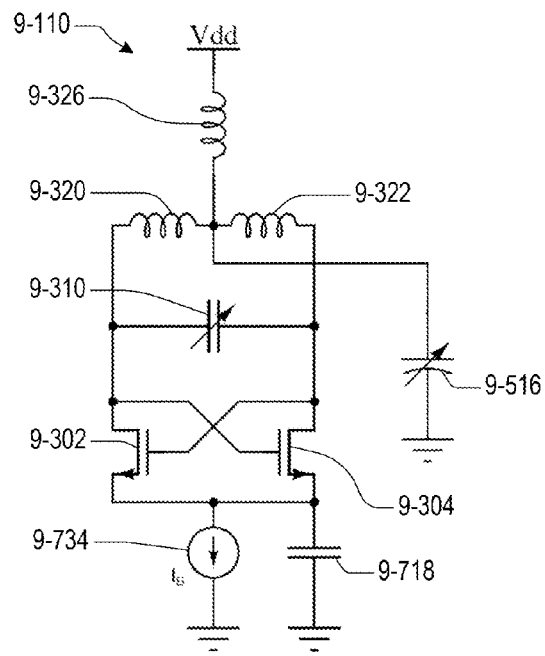
FIGS. 9-11 are schematics of current-biased oscillators according to other respective embodiments.

FIG. 9 is a schematic of a VCO 9-110 according to another embodiment. The VCO 9-110 is a current biased VCO like the VCO 7-110 of FIG. 7A, but differs from the VCO 7-110 by having a common-mode variable capacitor 9-516 connected to the common-mode port that the first and second inductor filaments 9-320 and 9-322 are connected to.

Because the bypass capacitor 9-718 acts as a short at high frequencies, at high frequencies the topology of the VCO 9-110 is substantially identical to the topology of the VCO 5-110C of FIG. 5C. As a result, the VCO 9-110 operates to minimize the upconversion of flicker noise in the same manner as the VCO 5-110C. As with the VCO 5-110C, in an embodiment having an adequate amount of inherent common-mode inductance, the common-mode variable capacitor 9-516 may be sufficient to produce the desired total phase shift $\phi_1$, and in such an embodiment the common-mode inductor 9-326 may be omitted.

Figure 10:
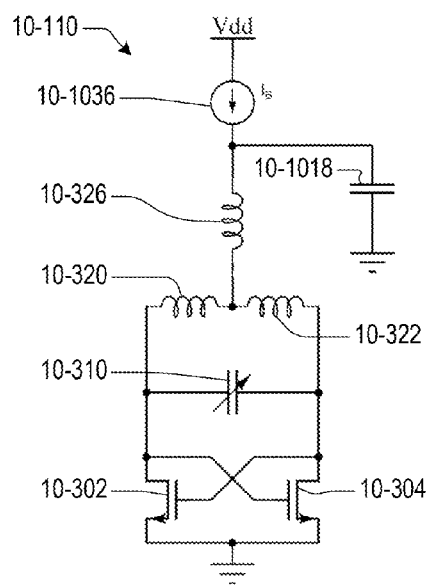

FIG. 10 is a schematic of a current biased VCO 10-110 according to another embodiment. The VCO 10-110 differs from the VCO 7-110 of FIG. 7A by having a constant current source 10-1036 connected between the power supply Vdd and the common-mode inductor 10-326, rather than between the sources of the first and second NMOS transistors 7-302 and 7-304 and ground as shown in FIG. 7A. A bypass capacitor 10-1018 is connected between the output of the constant current source 10-1036 and ground.

In the VCO 10-110, the oscillator current $I_B$ is set by the constant current source 10-1036. The bypass capacitor 10-1018 acts as a short at high frequencies, so that at high frequencies the topology of the VCO 10-110 is effectively identical to the topology of the VCO 3-110 of FIG. 3A. As a result. the VCO 10-110 operates to reduce or substantially eliminate upconversion of the flicker noise in the same manner as the VCO 3-110, as described above, by using the common-mode inductor 10-326 to cause a common-mode resonance frequency of the VCO 10-110 to be slightly higher than a second harmonic of the oscillator carrier and an imaginary part $Z_i$ of a common-mode impedance to have a positive value at the second harmonic of the oscillator carrier.

Figure 11:
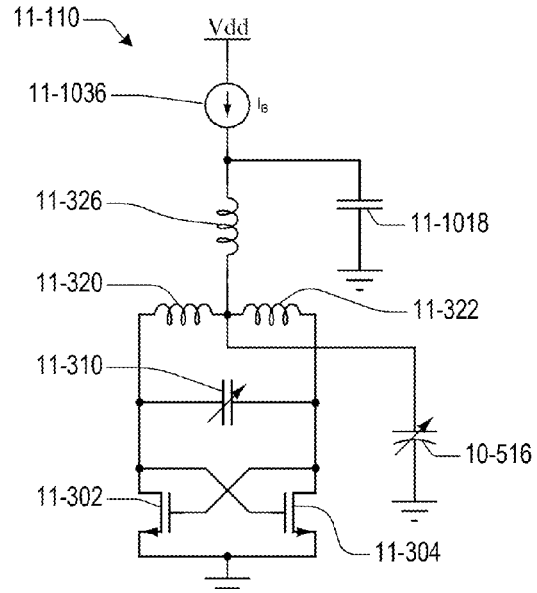

FIG. 11 is a schematic of a VCO 11-110 according to another embodiment. The VCO 11-110 is a current biased VCO like the VCO 10-110 of FIG. 10, but differs from the VCO 10-110 by having a common-mode variable capacitor 11-516 connected to the common-mode port to which the first and second inductor filaments 11-320 and 11-322 are connected.

Because the bypass capacitor 11-1018 acts as a short at high frequencies, at high frequencies the topology of the VCO 11-110 is substantially identical to the topology of the VCO 5-110C of FIG. 5C. As a result, the VCO 11-110 operates to minimize the upconversion of flicker noise in the same manner as the VCO 5-110C. As with the VCO 5-110C, in an embodiment having an adequate amount of inherent common-mode inductance, the common-mode variable capacitor 11-516 may be sufficient to produce the desired total phase shift $\phi_1$, and in such an embodiment the common-mode inductor 11-326 may be omitted.

Figure 12:
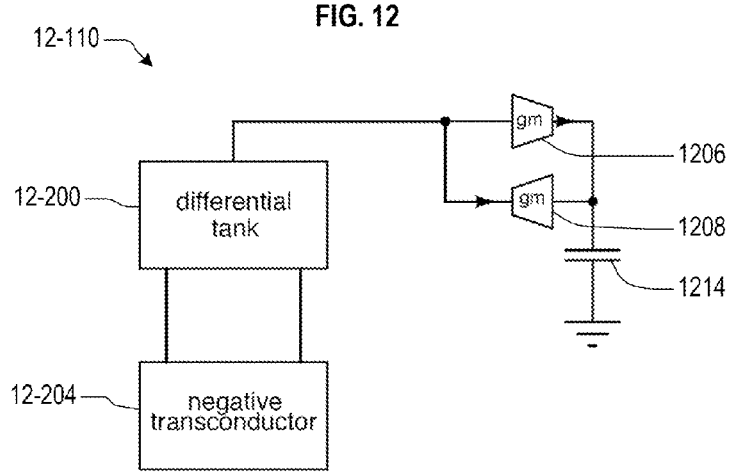
FIGS. 12 and 13 are diagrams of oscillators using active components to control a common-mode impedance according to other respective embodiments.

FIG. 12 is a diagram of a VCO 12-110 according to an embodiment in which the common-mode impedance of the VCO 12-110 is determined using active circuitry. The VCO 12-110 includes a differential tank circuit 12-200 coupled to a negative transconductor circuit 12-204.

A common-mode port of the differential tank circuit 12-200, such as common-mode port C of VCO 3-110 shown in FIG. 3A, is connected to an input of a first transconductor 1206 and an output of a second transconductor 1208. An output of the first transconductor 1206 is connected to an input of the second transconductor 1208 and to a first terminal of a capacitor 1214. A second terminal of the capacitor 1214 is connected to ground. The first and second transconductors 1206 and 1208 and the capacitor 1214 ma be embedded in an output stage of a voltage regulator that supplies a power supply voltage to the VCO 12-110.

The first and second transconductors 1206 and 1208 together operate as a gyrator circuit to transform the capacitance of the capacitor 1214 into a simulated inductance. Techniques and circuits for producing the first and second transconductor 1206 and 1208 and a simulated inductance using a gyrator circuit are well known to those skilled in the art.

The simulated inductance produced by the gyrator circuit operates in place of an actual inductor, such as the common-mode inductor 3-326 of VCO 3-110 of FIG. 3A, to produce a desired common-mode impedance of the VCO 12-110. In an embodiment, the capacitor 1214 includes a variable capacitor and a value of the simulated inductance is determined by selecting a capacitance of the capacitor 1214.

The value of the simulated inductance produced by the gyrator circuit is selected to minimize or substantially eliminate the upconversion of flicker noise in the VCO 12-110, in the same manner as described above for the VCO 3-110 of FIG. 3A. A simulated inductance may be more practical than an actual inductor for lower frequency oscillators.

Figure 13:
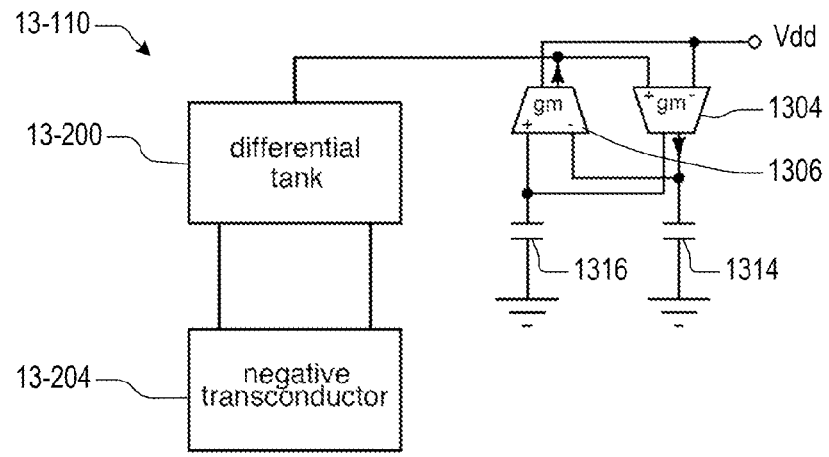

FIG. 13 is a diagram of a VCO 13-110 according to another embodiment in which the common-mode impedance of the VCO 13-110 is determined using active circuitry. The VCO 13-110 includes a differential tank circuit 13-200 coupled to a negative transconductor circuit 13-204.

A common-mode port of the differential tank circuit 13-200, such as common-mode port C of VCO 3-110 shown in FIG. 3A, is connected to a non-inverting input of a fully-differential operational transconductance amplifier (FD-OTA) 1304 and to a non-inverting output of a second FD-OTA 1306. A power supply Vdd is connected to an inverting input of the first FD-OTA 1304 and to an inverting output of the second FD-OTA 1306. In an embodiment, the circuit formed by the first and second FD-OTAs 1304 and 1306 is connected in series between the differential tank circuit 13-200 and a voltage regulator supplying the power supply Vdd.

A non-inverting output of the first FD-OTA 1304 is connected to an inverting input of the second FD-OTA 1306 and to a first terminal of a first capacitor 1314. An inverting output of the first FD-OTA 1304 is connected to a non-inverting input of the second FD-OTA 1306 and to a first terminal of a second capacitor 1316. Second terminals of the first and second capacitors 1314 and 1316 are connected to ground.

The first and second FD-OTAs 1304 and 1306 together operate as a gyrator circuit to transform the capacitances of the first and second capacitors 1314 and 1316 into a simulated. inductance. Techniques and circuits for implementing the first and second FD-OTAs 1304 and 1306 are well known to those skilled in the art.

The simulated inductance produced by the gyrator circuit operates in place of an actual inductor, such as the common-mode inductor 3-326 of VCO 3-110 of FIG. 3A, to produce a desired common-mode reactance of the VCO 13-110. The value of the simulated inductance produced by the gyrator circuit is selected to minimize or substantially eliminate the upconversion of flicker noise in the VCO 13-110, in the same manner as described above for the VCO 3-110.

Figure 14:
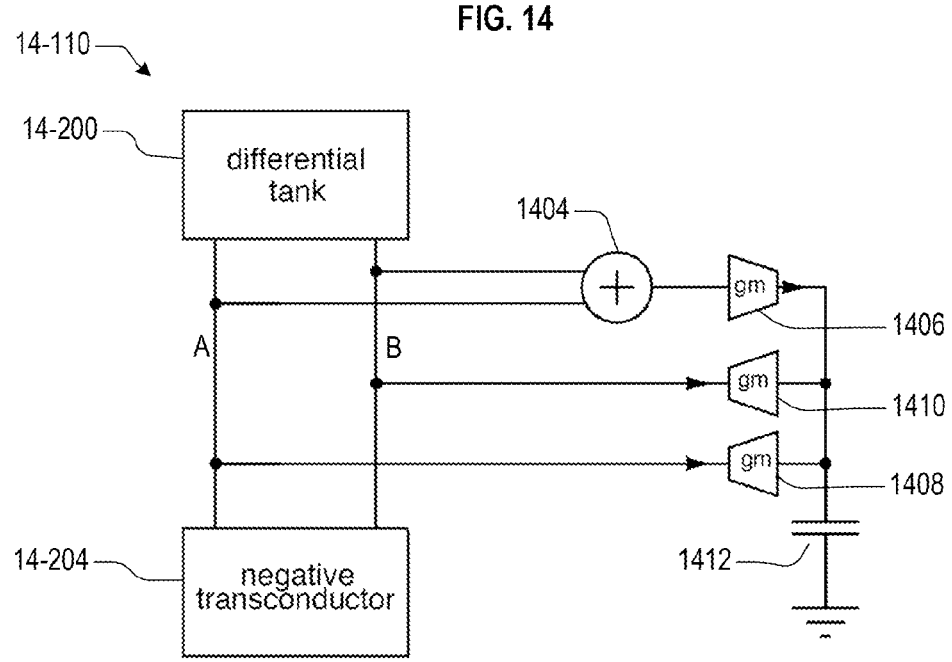
FIG. 14 is a diagram of an oscillator using active components to control a common-mode impedance through differential ports of the oscillator according to an embodiment.

FIG. 14 is a diagram of a VCO 14-110 according to an embodiment in which the common-mode impedance of the VCO 14-110 is determined using active circuitry. In the VCO 14-110, the active circuitry provides a simulated common-mode inductance without using a common-mode port of a differential tank 14-200. The embodiment shown in FIG. 14 may be employed in VCOs which do not have an accessible common-mode port.

The VCO 14-110 includes a negative transconductor circuit 14-204 connected to the differential tank circuit 14-200 using first and second differential ports A and B. First and second inputs of a summing circuit 1404 are connected to the first and second differential ports A and B, respectively. An output of the summing circuit 1404, corresponding to a common-mode voltage of the first and second differential ports A and B, is connected to an input of a first transconductor 1406.

An output of the first transconductor 1406 is connected to inputs of second and third transconductors 1408 and 1410 and to a first terminal of a capacitor 1412. An output of the second and third transconductors 1408 and 1410 is connected to the first and second differential ports A and B, respectively. A second terminal of the capacitor 1412 is connected to ground.

The circuit formed by the summing circuit 1404, the first, second, and third transconductors 1406, 1408, and 1410, and the capacitor 1412 operates to provide a simulated common-mode inductance of the VCO 14-110. The value of the simulated common-mode inductance is selected to minimize or substantially eliminate the upconversion of flicker noise in the VCO 14-110, in a similar manner as described above for the VCO 3-110.

Figure 15A:
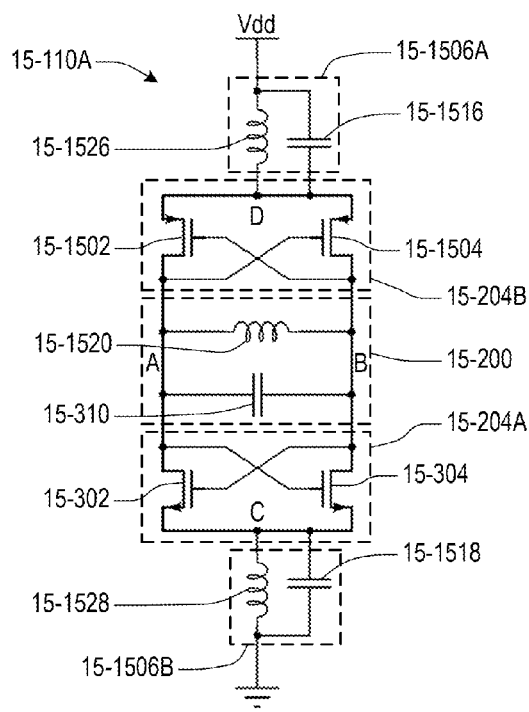
FIGS. 15A and 15B are schematics of voltage-biased Complementary MOS (CMOS) oscillators according to respective embodiments.

FIG. 15A is a schematic of a voltage-biased Complementary MOS (CMOS) oscillator 15-110A according to an embodiment. The oscillator 15-110A includes a differential tank circuit 15-200, first and second negative transconductor circuits 15-204A and 15-204B, and first and second common-mode tank circuits 15-1506A and 15-1506B.

The differential tank circuit 15-200 includes a first differential capacitor 15-310 connected between first and second differential ports A and B, and a first differential inductor 15-1520 also connected between the first and second differential ports A and B. In an embodiment, the first differential capacitor 15-310 is a variable capacitor.

The first negative transconductor circuit 15-204A includes first and second N-channel MOS (NMOS) transistors 15-302 and 15-304. Sources of the first and second NMOS transistors 15-302 and 15-304 are connected to a first common port C. A drain of the first NMOS transistor 15-302 is connected to the first differential port A of the differential tank circuit 15-200 and to a gate of the second NMOS transistor 15-304. A drain of the second NMOS transistor 15-304 is connected to the second differential port B of the differential tank circuit 15-200 and to a gate of the first NMOS transistor 15-302.

The second negative transconductor circuit 15-204B includes first and second P-channel MOS (PMOS) transistors 15-1502 and 15-1504. Sources of the first and second PMOS transistors 15-1502 and 15-1504 are connected to a second common port D. A drain of the first PMOS transistor 15-1502 is connected to the first differential port A of the differential tank circuit 15-200 and to a gate of the second PMOS transistor 15-1504. A drain of the second PMOS transistor 15-1504 is connected to the second differential port B of the differential tank circuit 15-200 and to a gate of the first PMOS transistor 15-1502.

The first common-mode tank circuit 15-1506A includes a first common-mode inductor 15-1526 and a first common-mode capacitor 15-1516 connected in parallel between the second common port D and a supply voltage Vdd. The second common-mode tank circuit 15-1506B includes a second common-mode inductor 15-1528 and a second common-mode capacitor 15-1518 connected in parallel between the first common port C and ground.

A common-mode impedance of the oscillator 15-110A may be controlled using the first and second common-mode tank circuits 15-1506A and 15-1506B. A value of the common-mode impedance is selected to minimize or substantially eliminate the upconversion of flicker noise in the oscillator 15-110A, in a similar manner as described above for the VCO 3-110.

Figure 15B:
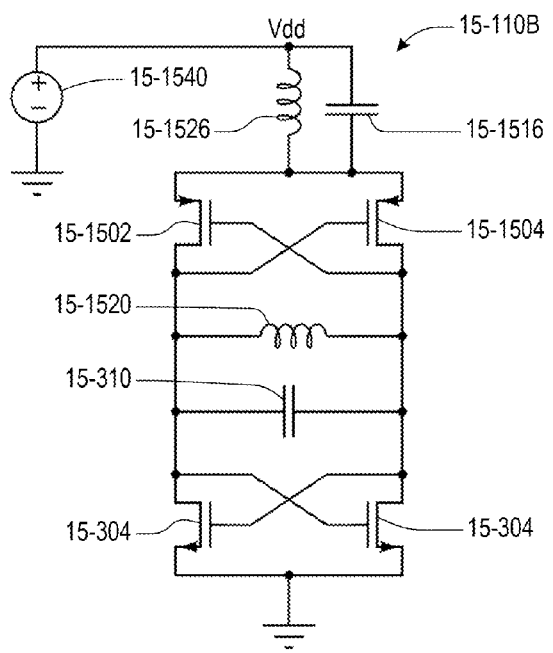

FIG. 15B is a schematic of a voltage-biased CMOS oscillator 15-110B according to another embodiment. The oscillator 15-110B differs from the oscillator 15-110A by the absence of the second common-mode tank circuit 15-1506B. FIG. 15B also shows a voltage source 15-1540 that provides the supply voltage Vdd.

A common-mode impedance of the oscillator 15-110B may be controlled using a first common-mode inductor 15-1526 and a first common-mode capacitor 15-1516. A value of the common-mode impedance is selected to substantially reduce the upconversion of flicker noise in the oscillator 15-110B, in a similar manner as described above for the VCO 3-110.

The voltage source 15-1540 also introduces flicker noise into the oscillator 15-110B. The upconversion of the flicker noise introduced by the voltage source 15-1540 is substantially reduced by controlling the value of the common-mode impedance of the oscillator 15-110B as the flicker noise generated within the oscillator 15-110B is.

Figure 16:
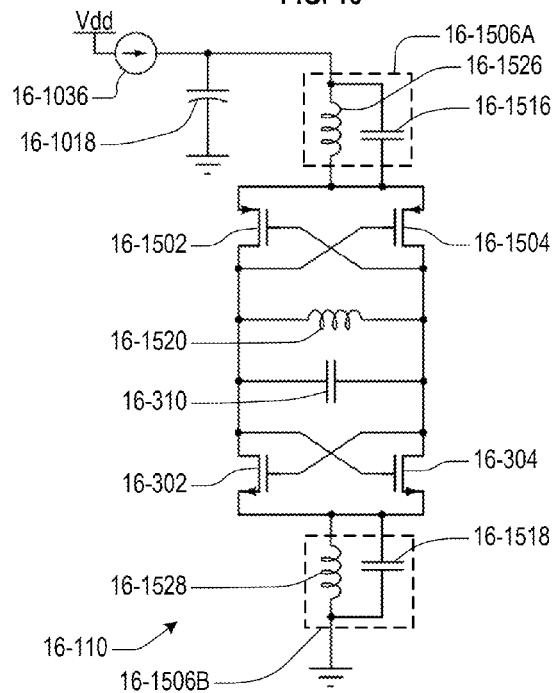
FIG. 16 is a schematic of a top-current-biased CMOS oscillator according to an embodiment.

FIG. 16 is a schematic of a top-current-biased CMOS oscillator 16-110 according to an embodiment. The oscillator 16-110 is substantially similar to the oscillator 15-110A of FIG. 15A, and differs from the oscillator 15-110A by the inclusion of a current source 16-1036 and a bypass capacitor 16-1018.

A first terminal of the current source 16-1036 is connected to a supply voltage Vdd. A second terminal of the current source 16-1036 is connected to a first terminal of the bypass capacitor 16-1018, a first terminal of a first common-mode inductor 16-1526, and a first terminal of a first common-mode capacitor 16-1516. A second terminal of the bypass capacitor 16-1018 is connected to ground.

Figure 17:
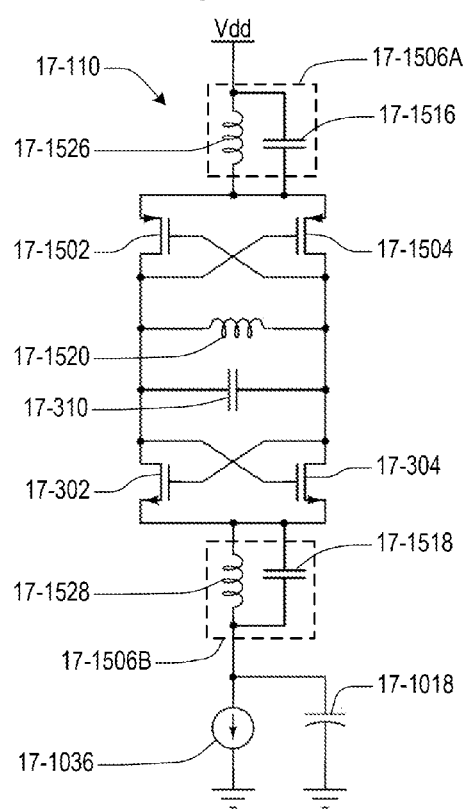
FIG. 17 is a schematic of a bottom-current-biased CMOS oscillator according to an embodiment.

FIG. 17 is a schematic of a bottom-current-biased CMOS oscillator according to an embodiment. The oscillator 17-110 is substantially similar to the oscillator 16-110 of FIG. 16, and differs from the oscillator 16-110 by where a current source 17-1036 and a bypass capacitor 17-1018 are connected in the circuit.

A first terminal of the current source 17-1036 is connected to ground. A second terminal of the current source 17-1036 is connected to a first terminal of the bypass capacitor 17-1018, a first terminal of a second common-mode inductor 17-1528, and as first terminal of a second common-mode capacitor 17-1518. A second terminal of the bypass capacitor 17-1018 is connected to ground.

In both the oscillator 16-110 and the oscillator 17-110, a common-mode impedance of the respective oscillators may be controlled to substantially reduce the upconversion of flicker noise, in a similar manner as described above for the oscillator 15-110A. Upconversion of flicker noise generated by components of the oscillators and of flicker noise introduced into the oscillators by external circuits such as a power supply may both be reduced.

In the oscillator 16-110 of FIG. 16, either of first and second common-mode tank circuits 16-1506A or 16-1506B, or both, may be required in order to minimize the upconversion of flicker noise, depending on the application at hand. In the oscillator 17-110 of FIG. 17, either of first and second common-mode tank circuits 17-1506A or 17-1506B, or both, may be required in order to minimize the upconversion of flicker noise, depending on the application at hand.

Figure 18:
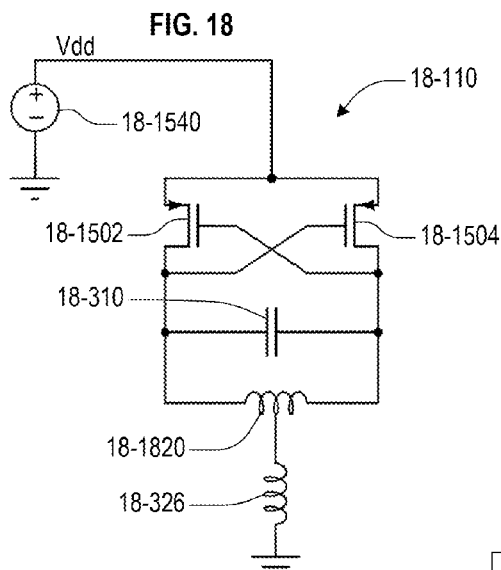
FIG. 18 is a schematic of a voltage-biased P-channel MOS oscillator according to at embodiment.

FIG. 18 is a schematic of a voltage-biased P-channel MOS (PMOS) oscillator 18-110 according to an embodiment. The oscillator 18-110 includes a negative transconductor circuit including first and second PMOS transistors 18-1502 and 18-1504, a differential tank circuit including a differential capacitor 18-310 and a center-tapped differential inductor 18-1820, and a common-mode reactance circuit including a common-mode inductor 18-326. In an embodiment, the differential capacitor 18-310 is a variable capacitor.

Sources of the first and second PMOS transistors 18-1502 and 18-1504 are connected to a supply voltage Vdd provided by a power supply 18-1540. A drain of the first PMOS transistor 18-1502 is connected to a gate of the second PMOS transistor 18-1504, a first terminal of the differential capacitor 18-310, and a first outer tap of the differential inductor 18-1820. A drain of the second PMOS transistor 18-1504 is connected to a gate of the first PMOS transistor 18-1502, a second terminal of the differential capacitor 18-310, and a second outer tap of the differential inductor 18-1820.

A center tap of the differential inductor 18-1820 is connected to a first terminal of the common-mode inductor 18-326. A second terminal of the common-mode inductor 18-326 is connected to ground.

A common-mode impedance of the oscillator 18-110 may be controlled using common-mode inductor 18-326. A value of the common-mode impedance is selected to minimize or substantially eliminate upconversion of flicker noise in the oscillator 18-110, in a similar manner as described above for the VCO 3-110. Upconversion of flicker noise generated by components of the oscillator 18-110 and of flicker noise introduced into the oscillators by external circuits, such as the power supply 18-1540, may both be reduced.

Figure 19:
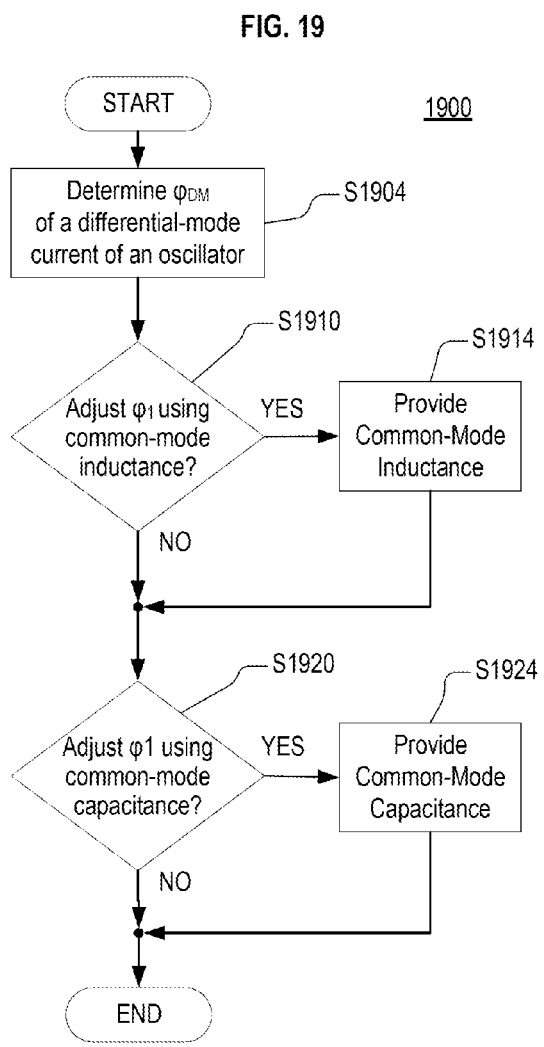
FIG. 19 is a flowchart of a process for controlling a common-mode impedance of an oscillator according to an embodiment.

FIG. 19 is a flowchart of a process 1900 of controlling a common-mode impedance of an oscillator circuit using a differential tank circuit. The common-mode impedance is controlled to adjust a total phase shift $\phi_1$, where the total phase shift $\phi_1$ is equal to the sum of a differential-mode phase shift $\phi_{DM}$ and a common-mode phase shift $\phi_{CM}$. The differential-mode phase shift $\phi_{DM}$ is the phase difference between a differential-mode current in an active device of the oscillator circuit relative to a voltage across the active device. The phase shift $\phi_{CM}$ is a phase difference between a differential-mode current through the active device and the voltage across the active device, as a result of the common-mode behavior of the oscillator circuit.

The total phase shift $\phi_1$ is controlled to minimize upconversion of flicker noise in the oscillator. In an embodiment, the common-mode impedance is controlled to that the total phase shift $\phi_1$ is substantially equal to zero.

At S1904, the differential-mode phase shift $\phi_{DM}$ is determined. In an embodiment, the differential-mode phase shift $\phi_{DM}$ is determined using Equation 6, above. In another embodiment, the differential-mode phase shift $\phi_{DM}$ is determined using simulation of the oscillator circuit.

At S1910, whether to adjust the total phase shift $\phi_1$ by intentionally providing a common-mode inductance is determined. In an embodiment, a common-mode inductance is not intentionally provided when the inherent common-mode inductance of the oscillator circuit is sufficient to produce a desired value of the common-mode phase shift $\phi_{CM}$.

If at S1910 it is determined to provide the common-mode inductance, at S1914, the common-mode inductance is provided. In an embodiment, the common-mode inductance is provided by connecting an inductor between a common-mode port of the differential tank circuit and a supply voltage. In an embodiment, the common-mode inductance is provided by connecting an active circuit that provides a simulated inductance to the common-mode port of the differential tank circuit. In an embodiment, the common-mode port is a part connected between first and second inductor filaments of the differential tank circuit.

In an embodiment, the common-mode inductance is provided by connecting an active circuit that provides a simulated common-mode inductance to first and second differential ports of the differential tank circuit.

At S1920, whether to adjust a total phase shift $\phi_1$ by intentionally providing a common-mode capacitance is determined. In an embodiment, a common-mode capacitance is not intentionally provided when the inherent common-mode capacitance of the oscillator circuit is sufficient to produce a desired value of the common-mode phase shift $\phi_{CM}$.

If at S1920 it is determined to provide the common-mode capacitor, at S1924, the common-mode capacitor is provided. In an embodiment, the common-mode capacitor is provided by connecting a capacitor between a common-mode port of the differential tank circuit and ground.

In an embodiment, the common-mode port is a port connected between first and second inductor filaments of the differential tank circuit. In an embodiment, the common-mode port is connected between first and second capacitors of the differential tank circuit. In an embodiment, the common-mode capacitor is a variable capacitor.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. A circuit comprising:
an oscillator to output an oscillator carrier, the oscillator including a differential tank circuit, an active device, and a common-mode reactance circuit,
wherein the differential tank circuit includes a first variable capacitor and a second variable capacitor each coupled to a common-mode port of the differential tank circuit,
wherein the common-mode reactance circuit includes a common-mode variable capacitor coupled to the common-mode port of the differential tank circuit,
wherein a phase difference between a voltage of the oscillator carrier and a device current of the active device is adjusted to reduce upconversion of flicker noise of the oscillator,
wherein adjusting the phase difference to reduce upconversion of the flicker noise is performed by adjusting, using the common-mode reactance circuit, a common-mode impedance of the oscillator to generate, at a second harmonic of a frequency of the oscillator carrier and according to an imaginary part of the common-mode impedance, a phase shift of a common mode current that is substantially equal to a negative of a phase shift of a differential mode current in the active device, the second harmonic being a frequency twice the frequency of the oscillator carrier, and
wherein adjusting the common-mode impedance includes adjusting the common-mode impedance to have the imaginary part substantially equal to a value $Z_i$ at the second harmonic of the frequency of the oscillator carrier, the value $Z_i$ being determined by:

$$Z_i = \frac{3 \cdot g_3 \cdot (g_1 \cdot R - 1)}{16 \cdot g_2^2 \cdot Q}$$

wherein $g_1$ represents a linear component of a transconductance of the active device, $g_2$ represents a second order non-linearity of the transconductance of the active device, $g_3$ represents a third order non-linearity of the transconductance of the active device, Q represents a tank quality factor of the oscillator, and R represents a resistance of a tank loss of the oscillator.

2. The circuit of claim 1, wherein the adjusted phase difference is substantially zero.

3. The circuit of claim 1, wherein the common-mode reactance circuit includes an active circuit connected to the common-mode port of the differential tank circuit.

4. The circuit of claim 1, wherein the common-mode variable capacitor is connected between the common-mode port of the differential tank circuit and ground.

5. The circuit of claim 1, wherein the oscillator is a current-biased oscillator.

6. The circuit of claim 1, wherein the oscillator is a voltage-biased oscillator.

7. The circuit of claim 1, wherein the circuit is provided in an integrated circuit.

8. A method comprising:
adjusting a phase difference between a voltage of an oscillator carrier generated by an oscillator and a device current of an active device of the oscillator,
wherein the adjusted phase difference is selected to reduce upconversion of flicker noise generated in the oscillator,
wherein adjusting the phase difference to reduce upconversion of the flicker noise includes adjusting, using a common-mode reactance circuit, a common-mode impedance of the oscillator to generate, at a second harmonic of a frequency of the oscillator carrier and according to an imaginary part of the common-mode impedance, a phase shift of a common mode current that is substantially equal to a negative of a phase shift of a differential mode current in the active device, the second harmonic being a frequency twice the frequency of the oscillator carrier,
wherein the oscillator includes a differential tank circuit including a first variable capacitor and a second variable capacitor each coupled to a common mode port of the differential tank circuit,
wherein the common-mode reactance circuit includes a common-mode variable capacitor coupled to the common mode port of the differential tank circuit, and
wherein adjusting the common-mode impedance includes adjusting the common-mode impedance to have the imaginary part substantially equal to a value $Z_i$ at the second harmonic of the frequency of the oscillator carrier, the value $Z_i$ being determined by:

$$Z_i = \frac{3 \cdot g_3 \cdot (g_1 \cdot R - 1)}{16 \cdot g_2^2 \cdot Q}$$

wherein $g_1$ represents a linear component of a transconductance of the active device, $g_2$ represents a second order non-linearity of the transconductance of the active device, $g_3$ represents a third order non-linearity of the transconductance of the active device, Q represents a tank quality factor of the oscillator, and R represents a resistance of a tank loss of the oscillator.

9. The method of claim 8, wherein adjusting the phase difference includes minimizing the phase difference.

10. The method of claim 8, wherein adjusting the phase difference includes adjusting a common-mode resonance frequency of the oscillator to be slightly above the second harmonic.

* * * * *